(12) United States Patent
Ito

(10) Patent No.: US 9,520,398 B1
(45) Date of Patent: Dec. 13, 2016

(54) INCLUDING LOW AND HIGH-VOLTAGE CMOS DEVICES IN CMOS PROCESS

(71) Applicant: BROADCOM CORPORATION, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/818,280

(22) Filed: Aug. 4, 2015

Related U.S. Application Data

(60) Provisional application No. 62/184,759, filed on Jun. 25, 2015.

(51) Int. Cl.

| | |
|---|---|
| *H01L 27/092* | (2006.01) |
| *H01L 29/78* | (2006.01) |
| *H01L 29/10* | (2006.01) |
| *H01L 29/06* | (2006.01) |
| *H01L 21/8238* | (2006.01) |
| *H01L 29/66* | (2006.01) |

(52) U.S. Cl.
CPC ... *H01L 27/0922* (2013.01); *H01L 21/823892* (2013.01); *H01L 29/0696* (2013.01); *H01L 29/1095* (2013.01); *H01L 29/66681* (2013.01); *H01L 29/7816* (2013.01)

(58) Field of Classification Search
CPC ............... H01L 27/092; H01L 27/0922; H01L 27/0202; H01L 27/11807; H01L 2924/0002
See application file for complete search history.

(56) References Cited

U.S. PATENT DOCUMENTS

| | | | | |
|---|---|---|---|---|
| 6,307,233 | B1 * | 10/2001 | Awaka | H01L 21/761 257/368 |
| 6,340,825 | B1 * | 1/2002 | Shibata | H01L 27/0207 257/207 |
| 2014/0167173 | A1 * | 6/2014 | Ito | H01L 29/66659 257/368 |
| 2014/0284712 | A1 * | 9/2014 | Ujiie | H01L 21/761 257/335 |

\* cited by examiner

*Primary Examiner* — Phuc Dang
(74) *Attorney, Agent, or Firm* — McDermott Will & Emery LLP

(57) ABSTRACT

A device includes a substrate, a deep well, a first well, and a second well. The deep well is formed in the substrate. The first well includes a first portion formed on the deep well and a second portion formed in the substrate. The second well is formed partially on the deep well. A first separator structure is formed on the deep well to isolate the first portion of the first well from the second well, and a second separator structure is formed on the substrate to isolate the second well and a second portion of the first well.

20 Claims, 8 Drawing Sheets

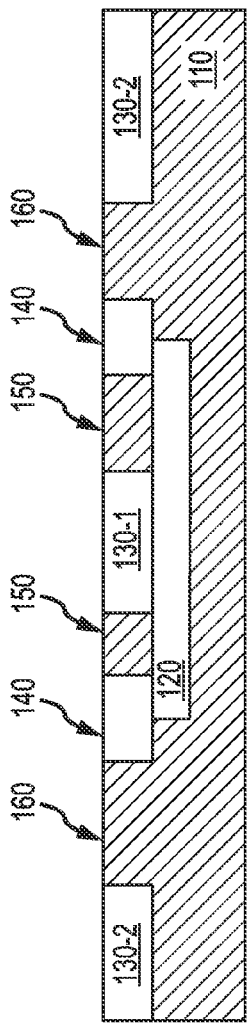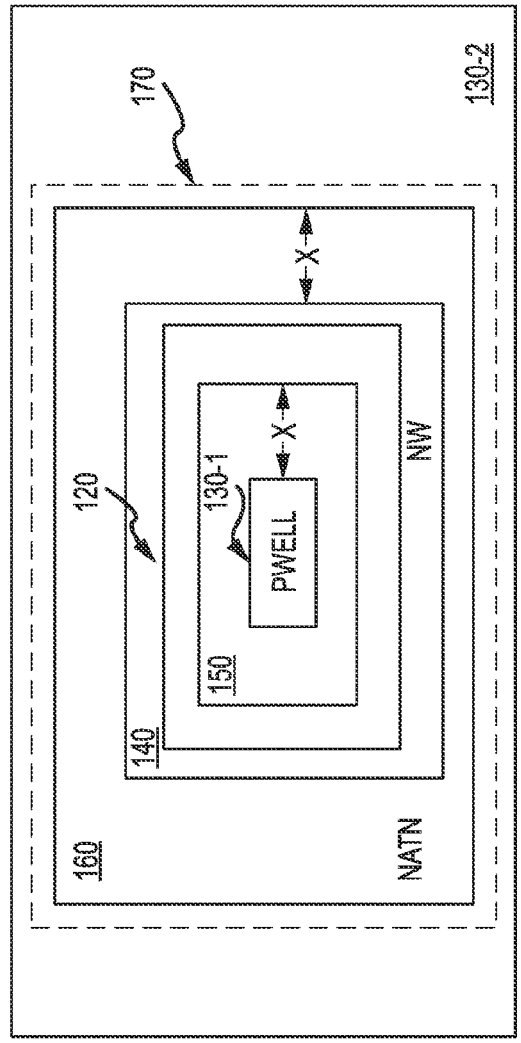
FIG.1A
FIG.1B

INCLUDING LOW AND HIGH-VOLTAGE CMOS DEVICES IN CMOS PROCESS

CROSS-REFERENCE TO RELATED APPLICATIONS

This application claims the benefit of priority under 35 U.S.C. §119 from U.S. Provisional Patent Application 62/184,759 filed Jun. 25, 2015, which is incorporated herein by reference in its entirety.

TECHNICAL FIELD

The present description relates generally to integrated circuits, and more particularly, but not exclusively, to including low and high-voltage CMOS devices in CMOS process.

BACKGROUND

Silicon semiconductor processing has evolved sophisticated operations for fabricating integrated circuits. As advancement in fabrication process technology continues, the core and input/output (I/O) operating voltages of integrated circuits have decreased. However, operating voltages of auxiliary devices have remained about the same. The auxiliary devices include devices interfaced to the integrated circuits. Examples of the auxiliary devices include printers, scanners, disk drives, tape drives, microphones, speakers, or cameras.

An integrated circuit can include an interconnected array of active and passive elements, such as transistors, resistors, capacitors, and inductors, integrated with or formed on a substrate by a series of compatible processes. The auxiliary devices may operate at voltages above a breakdown voltage of the transistors contained within the integrated circuit. As the operating voltages applied to the transistors increase, the transistors will eventually breakdown allowing an uncontrollable increase in current. Examples of the detrimental effects of breakdown include punch-through, avalanche breakdown, and gate oxide breakdown to provide some examples. Furthermore, operating above the breakdown voltage for a significant duration reduces the lifetime of the transistors.

The isolation breakdown voltage may be limited by Nwell-Pwell junction breakdown voltage, which is typically less than 12-15 volts for an advanced CMOS process. Low voltage laterally diffused MOS (LDMOS) used with drain supply voltage (VDD) less than Nwell-Pwell breakdown or MOS devices for some analog applications (e.g., power management unit (PMU)) can be implemented into a system-on-chip (SOC). Fuse circuits operate within less than 6-8V and can be safely isolated by PN junctions. Conventional CMOS devices can be in the low to medium voltage domain, for which the standard junction isolation can be used for the device isolation.

BRIEF DESCRIPTION OF THE DRAWINGS

Certain features of the subject technology are set forth in the appended claims. However, for purpose of explanation, several embodiments of the subject technology are set forth in the following figures.

FIGS. 1A-1B illustrate a cross-sectional view and a top view of an example semiconductor structure for implementing low and high-voltage CMOS devices in CMOS process in accordance with one or more implementations.

DETAILED DESCRIPTION

Figure 2A:
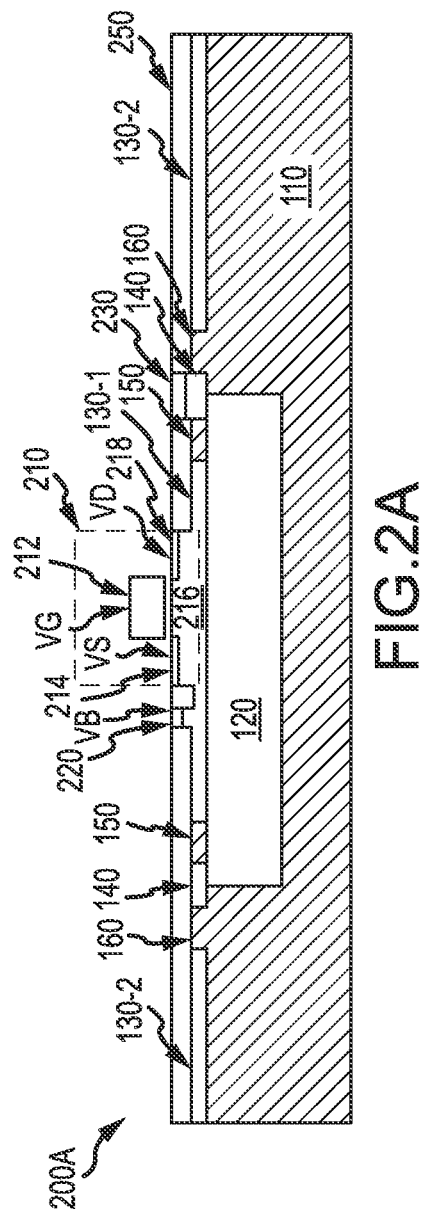
FIGS. 2A through 2B illustrate a cross-sectional view and a top view of an example NMOS device implemented using the structure of FIGS. 1A-1B in accordance with one or more implementations.

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

In one or more aspects of the subject technology, methods and configurations are described for including low-voltage devices (e.g., CMOS) and high-voltage Devices in the conventional CMOS process. The isolation technique of the subject technology allows integration, in a conventional system-on-chip (SOC), of high-voltage domain (e.g., 13-18 V) devices (e.g., CMOS) with a number of low-voltage circuitries such as non-volatile memories (NVMs), static random-access-memories (SRAMs) (e.g., with voltage range of 0.6V-1.2V), power management units (PMUs) (e.g., with voltage range of 0.75V-6V), fuses (e.g., with voltage range of 4V-13V), and other analog or digital circuitries (e.g., with voltage ranges of 0.6V-5V and 0.6V-3.3V, respectively). For a 40 nm CMOS technology, 15V LDMOS device have already been developed and are in use, for example, in devices employed in touch controller chips. It is understood that the junction isolation technique can be used for the device isolation. However, in applications that use more than 15V, which is more than Pwell/Nwell breakdown voltage (e.g., less than ~13V), conventional CMOS devices need to be in the high voltage domain.

FIGS. 1A-1B illustrate a cross-sectional view 100A and a top view 100B of an example semiconductor structure for implementing low and high-voltage CMOS devices in CMOS process in accordance with one or more implementations of the subject technology. The semiconductor structure, as shown in the cross-sectional view 100A and the top view 100B, includes a substrate 110, a deep well 120, a first well 130, a second well 140, a first separator structure 150, and second separator structure 160. The deep well 120 is formed in the substrate 110, a first portion 130-1 of the first well is formed on the deep well 120, and a second portion 130-2 of the first well is formed on the substrate 110. The second well 140 can be formed partially on the deep well and partially on the substrate 110. The first separator structure 150 is formed on the deep well 120 and isolates the first portion 130-1 of the first well 130 from the second well 140. The second separator structure 160 is formed on the substrate 110 and isolates the second well 140 and a second portion 130-2 of the first well 130. The deep well 120 would not be visible in the top view, but for clarity, in the top view 100B, the deep well 120 is depicted by a rectangle 120 showing the boundaries of the deep well 120.

In one or more implementations, the substrate 110 is a semiconductor substrate such as an N-type semiconductor substrate (Nsub), and the first and the second separator structures 150 and 160 are native semiconductor layers (e.g., of the same type of semiconductor material as the substrate 110). The first and the second separator structures 150 and 160 provide an isolated high-voltage domain 170, in which a high-voltage CMOS device can be formed. In one or more implementations, the deep well 120 is a deep Nwell (DNW), the first well 130 is a Pwell (PW), and the second well 140 is an Nwell (NW). The first and the second separator structures 150 and 160, which are native semiconductor layers are formed (e.g., implanted) using the N-type semiconductor material (e.g., NATN). The highest junction breakdown for the process is obtained with Pwell-DNW junction, which can restrict the operating voltage of any device formed in the structure. For many cases, this breakdown cannot be improved by any layout techniques.

The subject technology uses the second separator structures 160 to overcome the operating voltage restriction imposed by the Pwell-DNW junction. Further, the subject technology introduces the first separator structures 150 to enhance the breakdown voltage (e.g., less than ~13V) between the Pwell 130 and the Nwell 140. The enhancements of the breakdown voltages of the Pwell-DNW and Pwell-Nwell junctions are functions of separation (e.g., X) created by the blocking layers such as the separator structures 150 and 160. For example, for a 40 nm technology node and X~0.5 µm, the NW-NATN-PW breakdown voltage is greater than ~20V, and for PW-NATN-NW-NATN, the breakdown voltage is ~20V. The breakdown voltages increase by increasing the value of X. For example, for a 40 nm technology node and X~1 µm, the NW-NATN-PW breakdown voltage is greater than 29V and for PW-NATN-NW-NATN, the breakdown voltage is greater than ~29V, as well. The enhanced breakdown voltages of the subject technology allow safe operation of CMOS devices formed in the structures 100A and 100B.

Figure 2B:
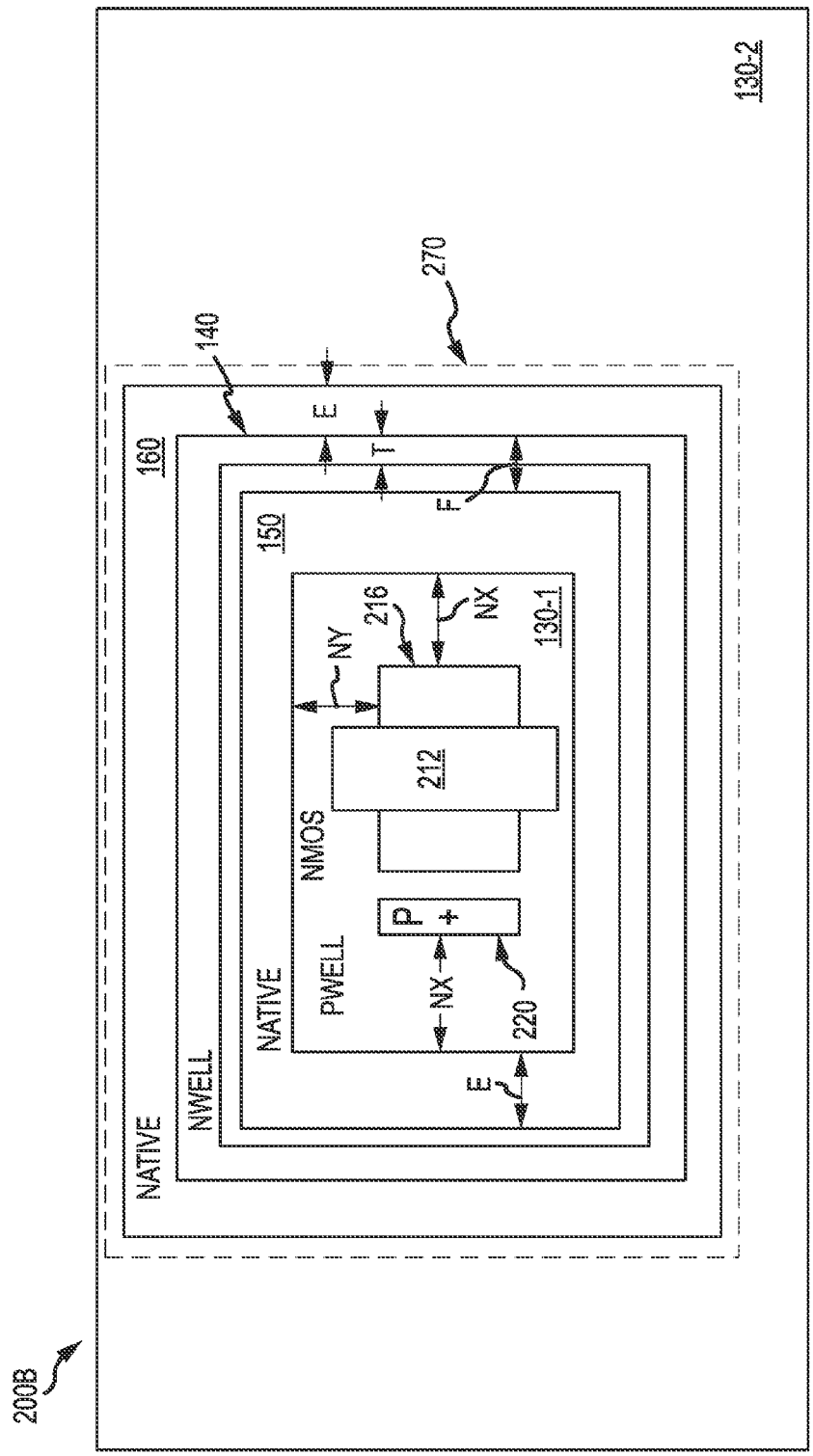

FIGS. 2A through 2B illustrate a cross-sectional view 200A and a top view 200B of an example NMOS device 210 implemented using the structure of FIGS. 1A-1B in accordance with one or more implementations of the subject technology. The cross-sectional view 200A and the top view 200B show placement of a conventional NMOS device (e.g., transistor) in the isolated high voltage domain 170 of FIG. 1B. The NMOS device 210 includes a gate 212 (e.g., a poly gate connected to VG), a source 214 (e.g., connected to VS), a channel 216, and a drain 218 (e.g., connected to VD). Example bias voltage values for various regions are provided herein. In some implementations, the DNW 120 can be tied to a high voltage domain voltage VDDH (e.g., 15V) and the Pwell 130 can be connected to VDDH-VDD, where VDD is the core or input/output (I/O) supply voltage (e.g., 14V). The gate voltage VG, the source voltage VS, and the drain voltage VD can be between VDDH (e.g., 15V) and VDDH-VDD (e.g., IV). For example, if the Pwell 130 is tied to 0V, the gate, source, and drain voltages can be between 0V and VDD. In some implementations, the Pwell can be tied to any potential between 0 to VDDH. In this case, the maximum gate-source voltage (VGS) has to be limited to VDD.

As also shown in FIG. 2B, the first portion 130-1 of the first well 130 includes the channel 214 of the NMOS transistor 210 and a body-tie region 220 that are formed in the isolated high-voltage domain 270, and are separated from a first and a second edge of the first well 130-1 by a first distance NX and a second distance NY, respectively. In one or more implementations, the first distance NX is larger than 80 nanometers and the second distance NY is approximately 160 nanometers. The body-tie region 220 is a highly-doped p-region. A width F of the second well 140 can, for example, be larger than 1 micrometer and a separation E between the second well 140 and the first well 130 is, for example, larger than 1 micrometer. As mentioned above, the subject technology can be used in a CMOS process, which includes both NMOS and PMOS devices. Implementation of a PMOS device using the subject technology is described below.

Figure 3A:
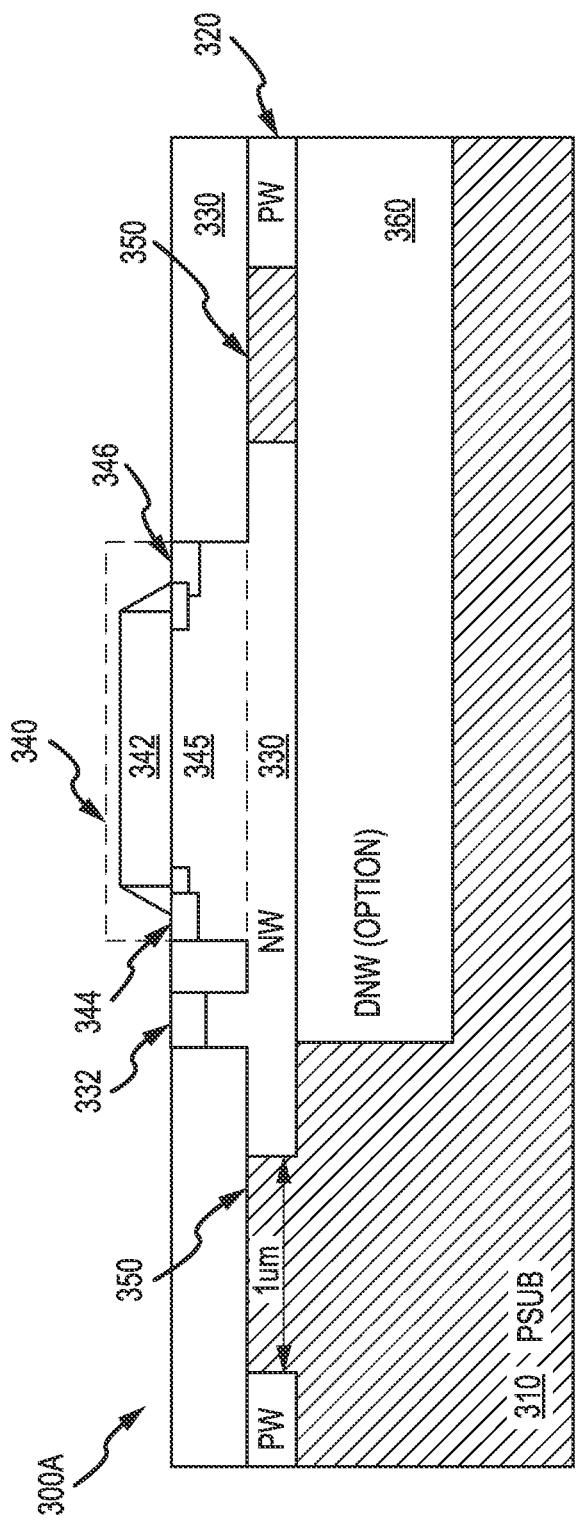
FIGS. 3A through 3B illustrate a cross-sectional view and a top view of an example PMOS device implemented using separator structures in accordance with one or more implementations.
Figure 3B:
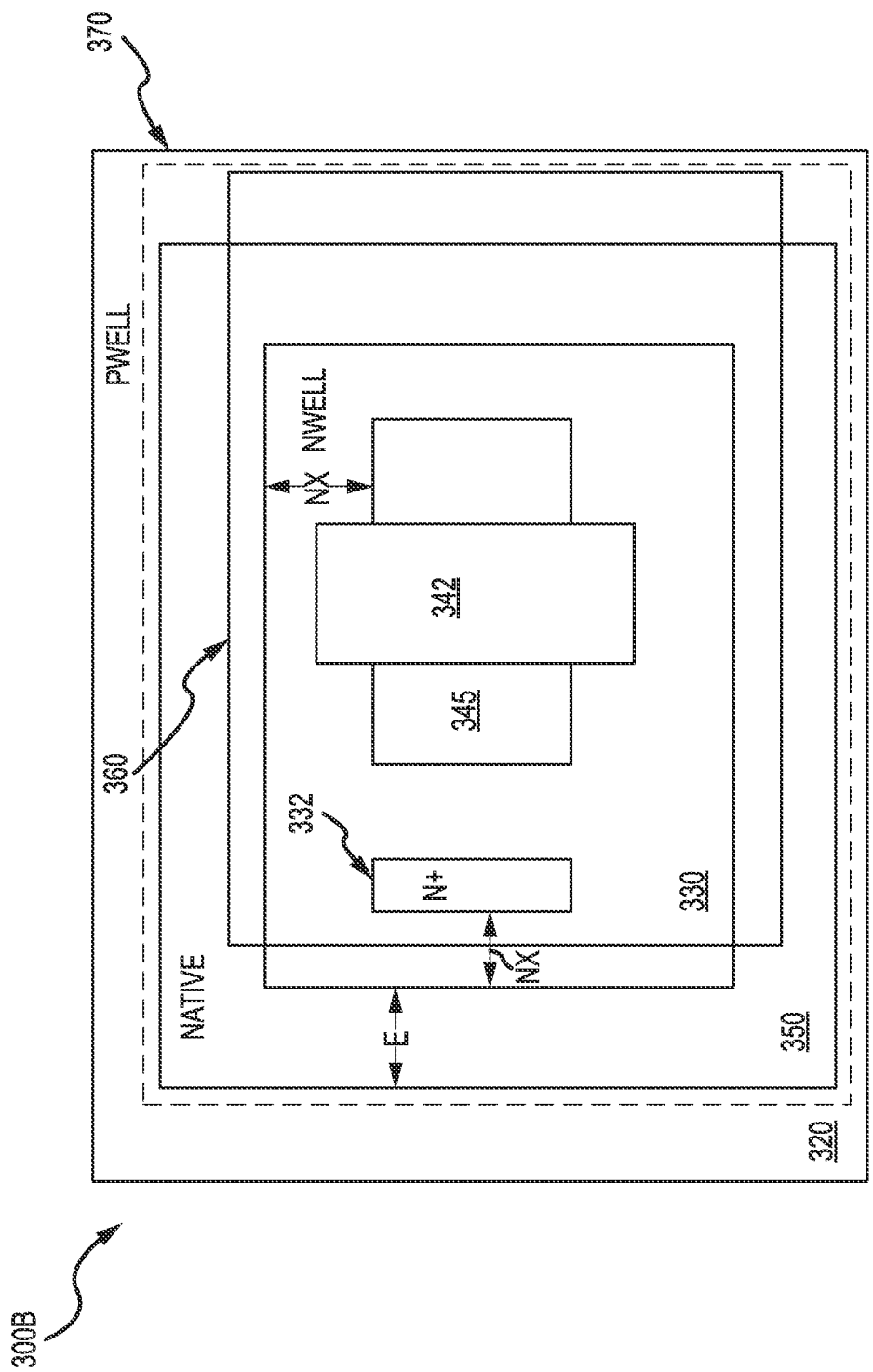

FIGS. 3A through 3B illustrate a cross-sectional view 300A and a top view 300B of an example PMOS device 340 implemented using separator structures in accordance with one or more implementations of the subject technology. In one or more implementations, as shown in the cross-sectional view 300A, the PMOS device 340 is placed in a semiconductor structure (e.g., device) including a substrate 310 (e.g., a P-type semiconductor (Psub)), a first well 320, a second well 330 and a separator structure 350. The first well 320 and the second well 330 are formed on the substrate 310. The separator structure (e.g., blocking layer) 350 can be formed on the substrate 310 to isolate the first well 320 from the second well 330. The MOS transistor (e.g., a PMOS) 340 is formed in the second well 330. The separator structure 350 is a native semiconductor layer. The native semiconductor layer 350 provides an isolated high-voltage domain 370 shown in FIG. 3B, on which the PMOS device 340 is formed. A body-tie region 332 is formed in the second well 330. In some implementations, the Nwell 330 and Pwell 320 can be formed, at least partially, on an optional deep Nwell 360. The first well 320 is a Pwell, the second well 330 is an Nwell, and the body-tie region 332 is a highly-doped n-region.

The PMOS device 340 includes a gate 342, a source 344, a drain 346 and a channel region 345. The channel region 345 and the body-tie region 332 are separated from a first and a second edge of the Nwell 330 by a first distance NX and a second distance NY, respectively. In one or more implementations, the first distance NX is larger than 80 nanometers and the second distance NY is approximately 160 nanometers. A separation E between the Nwell 330 and the Pwell 320 is, for example, larger than 1 micrometer.

The subject technology can be applied to high-K gate-last and gate-first processes. Further, although the subject disclosure included examples of CMOS device implementation, the application of the subject technology is not limited to CMOS process and can be applied to FinFet process technologies, as well.

Figure 4:
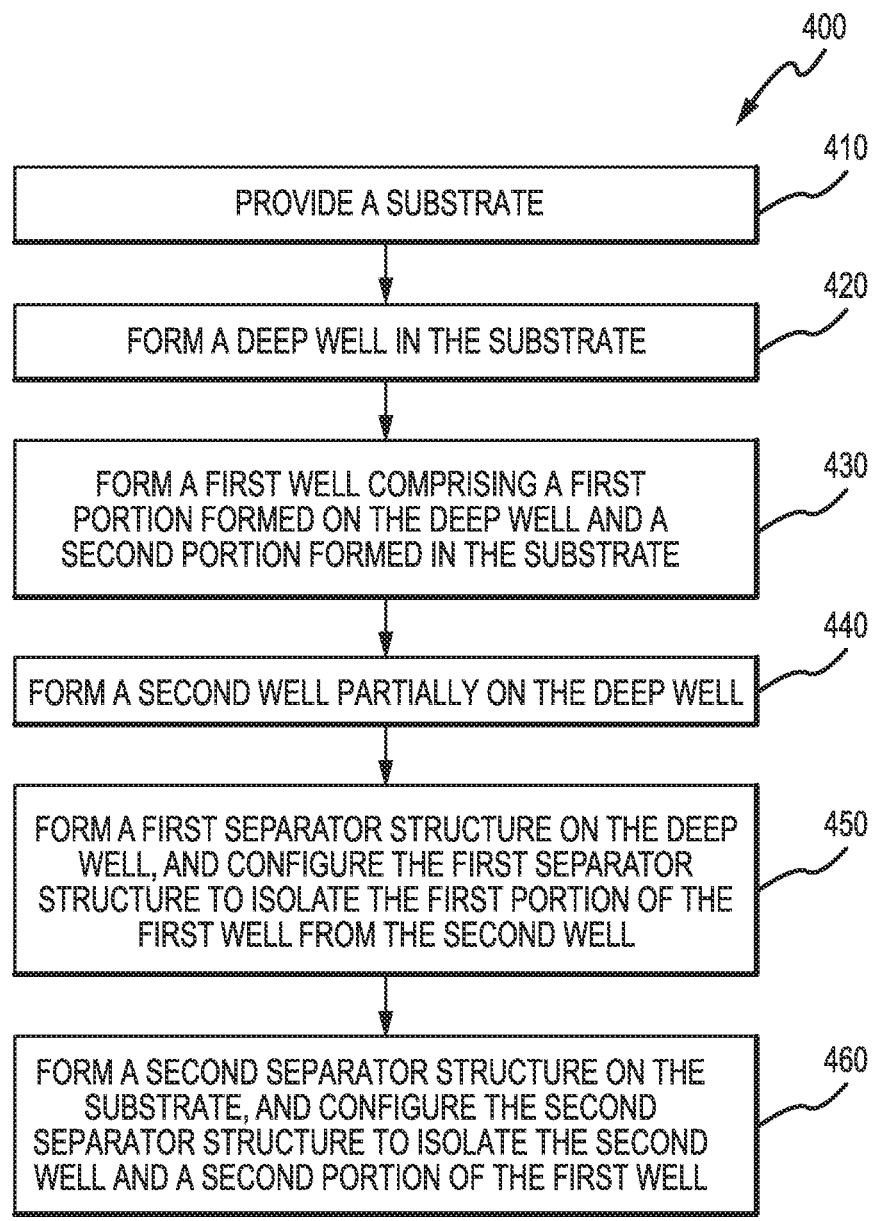
FIG. 4 illustrates an example of a method for providing the structure of FIGS. 1A-1B in accordance with one or more implementations.

FIG. 4 illustrates an example of a method 400 for providing the structure of FIGS. 1A-1B in accordance with one or more implementations of the subject technology. For explanatory purposes, the blocks of the example method 400 are described herein as occurring in serial, or linearly. However, multiple blocks of the example method 400 can occur in parallel. In addition, the blocks of the example method 400 need not be performed in the order shown and/or one or more of the blocks of the example method 400 need not be performed.

According to the method 400, a substrate (e.g., 110 of FIG. 1A) is provided (410). A deep well (e.g., 120 of FIG. 1A) is formed in the substrate (420). A first well (e.g., 130 of FIGS. 1A-1B) is formed that includes a first portion (e.g., 130-1 of FIGS. 1A-1B) formed on the deep well and a second portion (e.g., 130-2 of FIGS. 1A-1B) formed in the substrate (430). A second well (e.g., 140 of FIGS. 1A-1B) is formed partially on the deep well (440). A first separator structure (e.g., 150 of FIGS. 1A-1B) is formed on the deep well and is configured to isolate the first portion of the first well from the second well (450). A second separator structure (e.g., 160 of FIGS. 1A-1B) is formed on the substrate and is configured to isolate the second well and a second portion of the first well (460).

Figure 5:
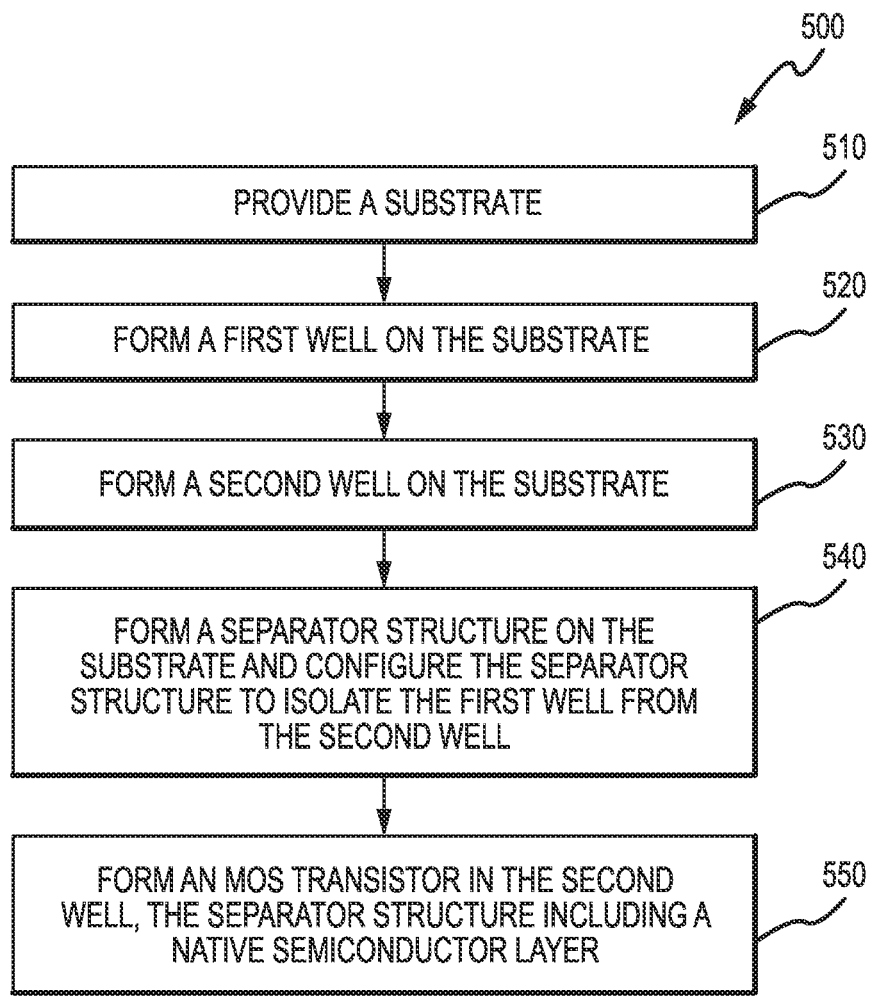
FIG. 5 illustrates an example of a method for providing PMOS devices of FIGS. 3A-3B in accordance with one or more implementations.

FIG. 5 illustrates an example of a method 500 for providing PMOS devices of FIGS. 3A-3B in accordance with one or more implementations of the subject technology. For explanatory purposes, the blocks of the example method 500 are described herein as occurring in serial, or linearly. However, multiple blocks of the example method 500 can occur in parallel. In addition, the blocks of the example method 500 need not be performed in the order shown and/or one or more of the blocks of the example method 500 need not be performed.

According to the method 500, a substrate (e.g., 310 of FIG. 3A) is provided (510). A first well (e.g., 320 of FIGS. 3A-3B) is formed on the substrate (520). A second well (e.g., 330 of FIGS. 3A-3B) is formed on the substrate (530). A separator structure (e.g., 350 of FIGS. 3A-3B) is formed on the substrate and is configured to isolate the first well from the second well (540). An MOS transistor (e.g., 340 of FIG. 3A) is formed in the second well, the separator structure includes a native semiconductor layer (550).

Figure 6:
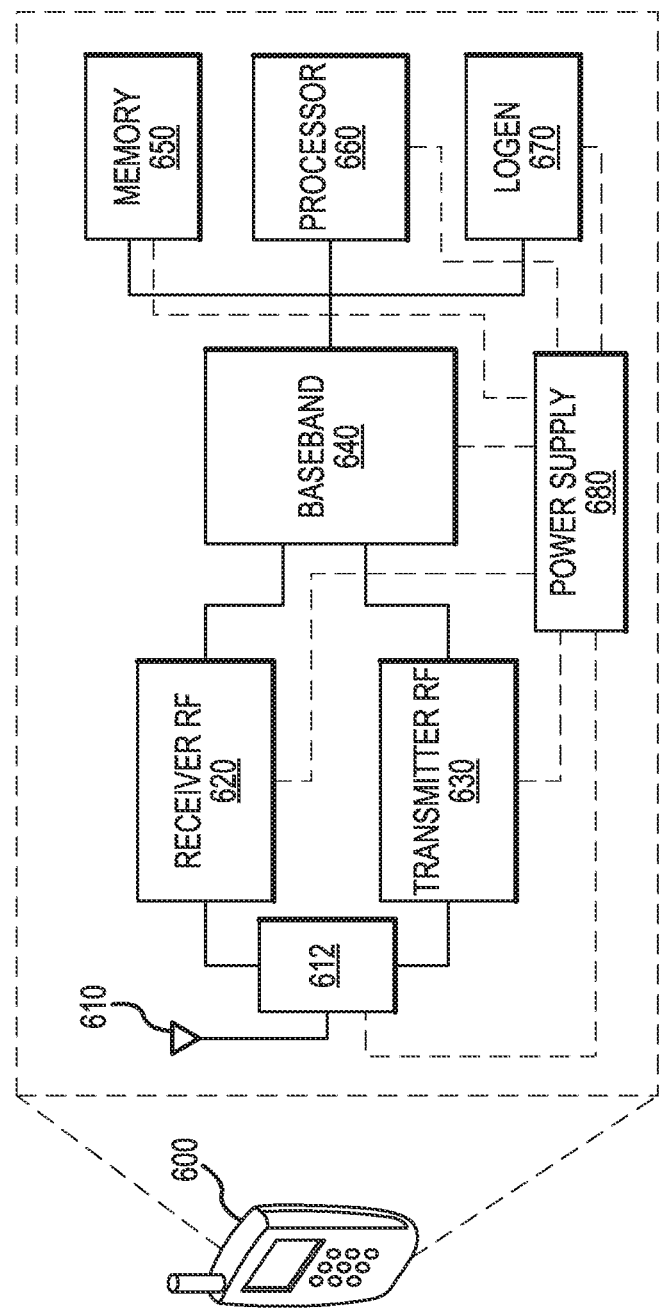
FIG. 6 illustrates an example of a wireless communication device employing features of the subject technology in accordance with one or more implementations.

FIG. 6 illustrates an example of a wireless communication device employing features of the subject technology in accordance with one or more implementations. The wireless communication device 600 includes a radio-frequency (RF) antenna 610, a receiver 620, a transmitter 630, a baseband processing module 640, a memory 650, a processor 660, a local oscillator generator (LOGEN) 670, a power supply 680 and a sensor module 690. In various embodiments of the subject technology, one or more of the blocks represented in FIG. 6 can be integrated on one or more semiconductor substrates. For example, the blocks 620-670 can be realized in a single chip or a single system on chip, or can be realized in a multi-chip chipset.

The RF antenna 610 can be suitable for transmitting and/or receiving RF signals (e.g., wireless signals) over a wide range of frequencies. Although a single RF antenna 610 is illustrated, the subject technology is not so limited.

The receiver 620 comprises suitable logic circuitry and/or code that can be operable to receive and process signals from the RF antenna 610. The receiver 620 may, for example, be operable to amplify and/or down-convert received wireless signals. In various embodiments of the subject technology, the receiver 620 is operable to cancel noise in received signals and can be linear over a wide range of frequencies. In this manner, the receiver 620 is suitable for receiving signals in accordance with a variety of wireless standards. Wi-Fi, WiMAX, Bluetooth, and various cellular standards.

The transmitter 630 comprises suitable logic circuitry and/or code that can be operable to process and transmit signals from the RF antenna 610. The transmitter 630 may, for example, be operable to up-convert baseband signals to RF signals and amplify RF signals. In various embodiments of the subject technology, the transmitter 630 is operable to up-convert and to amplify baseband signals processed in accordance with a variety of wireless standards. Examples of such standards include Wi-Fi, WiMAX, Bluetooth, and various cellular standards. In various embodiments of the subject technology, the transmitter 630 is operable to provide signals for further amplification by one or more power amplifiers.

The duplexer 612 provides isolation in the transmit band to avoid saturation of the receiver 620 or damaging parts of the receiver 620, and to relax one or more design requirements of the receiver 620. Furthermore, the duplexer 612 can attenuate the noise in the receive band. The duplexer is operable in multiple frequency bands of various wireless standards.

The baseband processing module 640 comprises suitable logic, circuitry, interfaces, and/or code that can be operable to perform processing of baseband signals. The baseband processing module 640 may, for example, analyze received signals and generate control and/or feedback signals for configuring various components of the wireless communication device 600 such as the receiver 620. The baseband processing module 640 is operable to encode, decode, transcode, modulate, demodulate, encrypt, decrypt, scramble, descramble, and/or otherwise process data in accordance with one or more wireless standards.

The processor 660 comprises suitable logic, circuitry, and/or code that can enable processing data and/or controlling operations of the wireless communication device 600. In this regard, the processor 660 is enabled to provide control signals to various other portions of the wireless communication device 600. The processor 660 can also control transfers of data between various portions of the wireless communication device 600. Additionally, the processor 660 can enable implementation of an operating system or otherwise execute code to manage operations of the wireless communication device 600.

The memory 650 comprises suitable logic, circuitry, and/or code that can enable storage of various types of information such as received data, generated data, code, and/or configuration information. The memory 650 includes, for example, RAM, ROM, flash, and/or magnetic storage. In various embodiment of the subject technology, the memory 650 may include a RAM, DRAM, SRAM, T-RAM, Z-RAM, TTRAM, or any other storage media.

The local oscillator generator (LOGEN) 670 comprises suitable logic, circuitry, interfaces, and/or code that can be operable to generate one or more oscillating signals of one or more frequencies. The LOGEN 670 can be operable to generate digital and/or analog signals. In this manner, the LOGEN 670 can be operable to generate one or more clock signals and/or sinusoidal signals. Characteristics of the oscillating signals such as the frequency and duty cycle can be determined based on one or more control signals from, for example, the processor 660 and/or the baseband processing module 640.

In operation, the processor 660 can configure the various components of the wireless communication device 600 based on a wireless standard according to which it is desired to receive signals. Wireless signals can be received via the RF antenna 610 and amplified and down-converted by the receiver 620. The baseband processing module 640 can perform noise estimation and/or noise cancellation, decoding, and/or demodulation of the baseband signals. In this manner, information in the received signal can be recovered and utilized appropriately. For example, the information can be audio and/or video to be presented to a user of the wireless communication device, data to be stored to the memory 650, and/or information affecting and/or enabling operation of the wireless communication device 600. The baseband processing module 640 can modulate, encode and perform other processing on audio, video, and/or control signals to be transmitted by the transmitter 630 in accordance to various wireless standards.

In some implementations of the subject technology, any of the circuits of the wireless communication device 600, for example, varies modules and/or components of the receiver 620, transmitter 630, and/or power supply 680 can be implemented using the MOS transistors (e.g., 210 of FIG. 2A or 340 of FIG. 3A) of the subject technology. By using the MOS transistor structures of the subject technology, the wireless communication device 600 can benefit from the advantageous features of the disclosed technology that allows including low-voltage and high-voltage CMOS devices in CMOS process, especially in power circuitries.

Those of skill in the art would appreciate that the various illustrative blocks, modules, elements, components, and methods described herein can be implemented as electronic hardware, computer software, or combinations of both. To illustrate this interchangeability of hardware and software, various illustrative blocks, modules, elements, components, and methods have been described above generally in terms of their functionality. Whether such functionality is implemented as hardware or software depends upon the particular application and design constraints imposed on the overall system. Skilled artisans can implement the described functionality in varying ways for each particular application. Various components and blocks can be arranged differently (e.g., arranged in a different order, or partitioned in a different way) all without departing from the scope of the subject technology.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

A phrase such as "an aspect" does not imply that such aspect is essential to the subject technology or that such aspect applies to all configurations of the subject technology. A disclosure relating to an aspect can apply to all configurations, or one or more configurations. An aspect can provide one or more examples of the disclosure. A phrase such as an "aspect" refers to one or more aspects and vice versa. A phrase such as an "embodiment" does not imply that such embodiment is essential to the subject technology or that such embodiment applies to all configurations of the subject technology. A disclosure relating to an embodiment can apply to all embodiments, or one or more embodiments. An embodiment can provide one or more examples of the disclosure. A phrase such an "embodiment" can refer to one or more embodiments and vice versa. A phrase such as a "configuration" does not imply that such configuration is essential to the subject technology or that such configuration applies to all configurations of the subject technology. A disclosure relating to a configuration can apply to all configurations, or one or more configurations. A configuration can provide one or more examples of the disclosure. A phrase such as a "configuration" can refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein can be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A device comprising:
   a substrate;
   a deep well formed in the substrate;
   a first well comprising a first portion formed on the deep well and a second portion formed in the substrate;
   a second well formed partially on the deep well;
   a first separator structure formed on the deep well and configured to isolate the first portion of the first well from the second well; and
   a second separator structure formed on the substrate and configured to isolate the second well and a second portion of the first well.

2. The device of claim 1, wherein the substrate comprises a semiconductor substrate, wherein the first and the second separator structures comprise native semiconductor layers and are configured to provide an isolated high-voltage domain.

3. The device of claim 2, wherein the first portion of the first well comprises a channel of an MOS transistor and a body-tie region formed in the isolated high-voltage domain.

4. The device of claim 3, wherein the body-tie region and the channel of the MOS transistor are separated from a first and a second edge of the first well by a first and a second distance, respectively, wherein the first distance is larger than 80 nanometers and the second distance is approximately 160 nanometers.

5. The device of claim 4, wherein the deep well comprises a deep Nwell, the first well comprises a Pwell, the second well comprises an Nwell, the body-tie region comprises a highly-doped p-region, and the MOS transistor comprises an NMOS transistor, and wherein a width of the second well is larger than 1 micrometer and a separation between the second well and the first well is larger than 1 micrometer.

6. A device comprising:
a substrate;
a first well formed on the substrate;
a second well formed on the substrate;
a separator structure formed on the substrate and configured to isolate the first well from the second well;
an MOS transistor formed in the second well;
a body-tie region formed in the second well; and
an optional deep Nwell,
wherein the separator structure comprises a native semiconductor layer configured to provide an isolated hi h-voltage domain.

7. The device of claim 6, wherein the first well comprises a Pwell, the second well comprises an Nwell, the body-tie region comprises a highly-doped n-region, and the MOS transistor comprises a PMOS transistor.

8. The device of claim 6, wherein the body-tie region and the channel of the MOS transistor are separated from a first and a second edge of the second well by a first distance, and wherein the first distance is larger than 80 nanometers, and wherein a separation between the first well and the second well is larger than 1 micrometer.

9. The device of claim 6, wherein the optional deep Nwell extends under the a portion of the first well and a portion of the second well, wherein an edge of the optional deep Nwell is at a second distance form an edge of the second well.

10. The device of claim 6, wherein a breakdown voltage between the first well and the second well is greater than a breakdown voltage between the first well and the deep Nwell.

11. A method for including low and high-voltage CMOS devices in CMOS process, the method comprising:
providing a substrate;
forming a deep well in the substrate;
forming a first well comprising a first portion formed on the deep well and a second portion formed in the substrate;
forming a second well partially on the deep well;
forming a first separator structure on the deep well, and configuring the first separator structure to isolate the first portion of the first well from the second well; and
forming a second separator structure on the substrate, and configuring the second separator structure to isolate the second well and a second portion of the first well.

12. The method of claim 11, wherein providing the substrate comprises providing a semiconductor substrate, wherein forming the first and the second separator structures comprise forming native semiconductor layers, and wherein the method further comprises configuring the first and the second separator structures to provide an isolated high-voltage domain.

13. The method of claim 12, further comprising forming, in the first portion of the first well, a channel of an MOS transistor and forming a body-tie region in the isolated high-voltage domain.

14. The method of claim 13, wherein forming the body-tie region and the channel of the MOS transistor to be separated from a first and a second edge of the first well by a first and a second distance, respectively, wherein the first distance is larger than 80 nanometers and the second distance is approximately 160 nanometers.

15. The method of claim 14, wherein:
forming the deep well comprises forming a deep Nwell,
forming the first well comprises forming a Pwell,
forming the second well comprises forming an Nwell,
forming the body-tie region comprises forming a highly-doped p-region,
the MOS transistor comprises an NMOS transistor, and
a width of the second well is larger than 1 micrometer and a separation between the second well and the first well is larger than 1 micrometer.

16. A method for including low and high-voltage CMOS devices in CMOS process, the method comprising:
providing a substrate;
forming a first well on the substrate;
forming a second well on the substrate;
forming a separator structure on the substrate and configuring the separator structure to isolate the first well from the second well;
forming an MOS transistor in the second well; and
forming a body-tie region in the second well and an optional deer Nwell,
wherein the separator structure comprises a native semiconductor layer configured to provide an isolated high-voltage domain.

17. The method of claim 16, wherein:
forming the first well comprises forming a Pwell,
forming the second well comprises forming an Nwell,
forming the body-tie region comprises forming a highly-doped n-region, and
the MOS transistor comprises a PMOS transistor.

18. The method of claim 16, wherein forming the body-tie region and the channel of the MOS transistor to be separated from a first and a second edge of the second well by a first distance, and wherein the first distance is larger than 80 nanometers, and wherein a separation between the first well and the second well is larger than 1 micrometer.

19. The method of claim 16, wherein:
forming the optional deep Nwell comprises extending the optional deep Nwell under the a portion of the first well and a portion of the second well, and
forming the optional deep Nwell comprises allowing an edge of the optional deep Nwell to be at a second distance form an edged of the second well.

20. The method of claim 16, wherein a breakdown voltage between the first well and the second well is greater than a breakdown voltage between the first well and the deep Nwell.

* * * * *

UNITED STATES PATENT AND TRADEMARK OFFICE
CERTIFICATE OF CORRECTION

PATENT NO. : 9,520,398 B1
APPLICATION NO. : 14/818280
DATED : December 13, 2016
INVENTOR(S) : Akira Ito It is certified that error appears in the above-identified patent and that said Letters Patent is hereby corrected as shown below:

In the Claims

Column 9, Lines 18-19 (Claim 6), replace "hi h-voltage" with --high-voltage--

Signed and Sealed this
Sixteenth Day of July, 2019

Andrei Iancu
*Director of the United States Patent and Trademark Office*